United States Patent [19]

Espindola et al.

[11] Patent Number: 5,999,546
[45] Date of Patent: Dec. 7, 1999

[54] MAGNETICALLY TUNABLE LASER WITH WAVELENGTH LATCHABILITY AND OPTICAL COMMUNICATION SYSTEM COMPRISING SUCH LASER

[75] Inventors: Rolando Patricio Espindola, Chatham; Sungho Jin, Millington; Hareesh Mavoori, Berkeley Heights, all of N.J.

[73] Assignee: Lucent Technologies Inc., Murray Hill, N.J.

[21] Appl. No.: 09/158,672

[22] Filed: Sep. 22, 1998

[51] Int. Cl.⁶ .................................................. H01S 3/10
[52] U.S. Cl. .............................. 372/20; 372/37; 372/64; 372/6; 372/102; 372/99; 385/37
[58] Field of Search ................................. 372/20, 37, 64, 372/6, 102, 99; 385/37

[56] References Cited

U.S. PATENT DOCUMENTS

| | | | |
|---|---|---|---|
| 4,397,025 | 8/1983 | Kebabian ................................. | 372/37 |
| 5,317,576 | 5/1994 | Leonberger et al. ..................... | 372/6 |
| 5,781,677 | 7/1998 | Jin et al. .................................. | 385/37 |
| 5,790,573 | 8/1998 | Heller ...................................... | 372/37 |

*Primary Examiner*—Leon Scott, Jr.

[57] ABSTRACT

In accordance with the invention, a tunable laser uses magnets to apply mechanical strain on fiber Bragg grating reflectors or laser cavities in order to induce a change in lasing wavelength. The strain can be tensile or compressive. The tunable laser comprises a laser cavity including a laser material for emitting light in response to stimulating light and two end reflectors one or more of which can be a Bragg grating. In preferred embodiments, latchable programmable magnets vary the grating periodicity and/or cavity length in a controlled, accurate manner so as to achieve desired tuning of the laser over a broad range of wavelengths. The latchable magnets hold the wavelength in the shifted position without the need for sustained power.

16 Claims, 4 Drawing Sheets

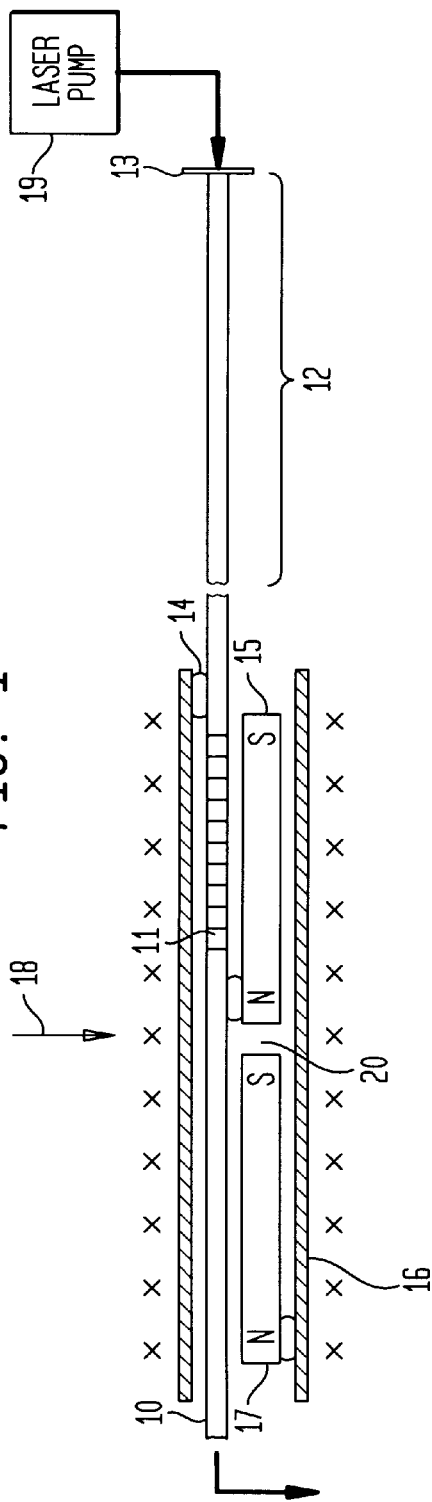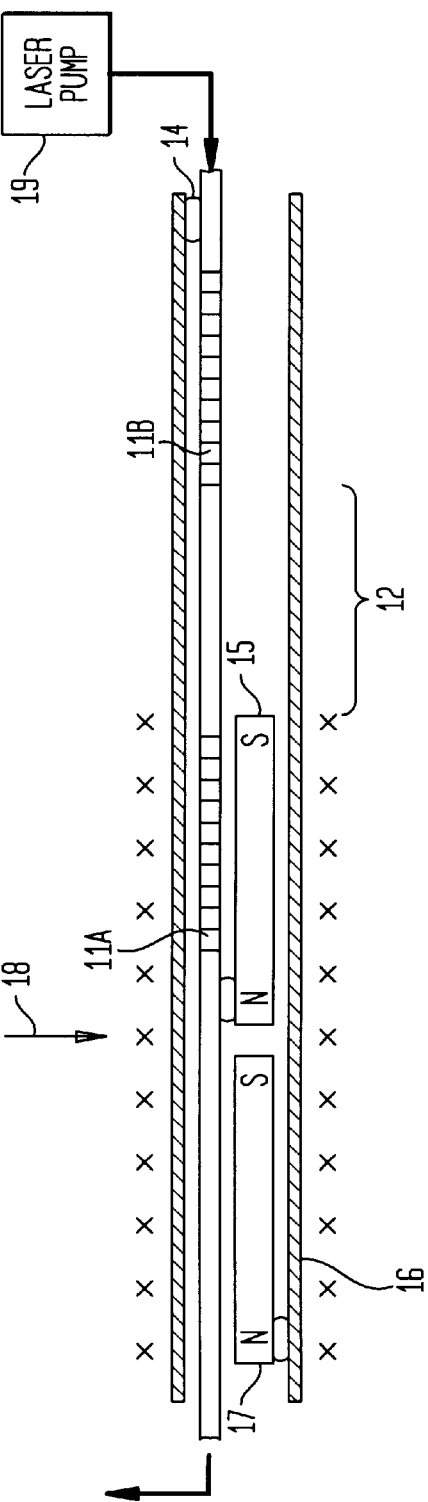

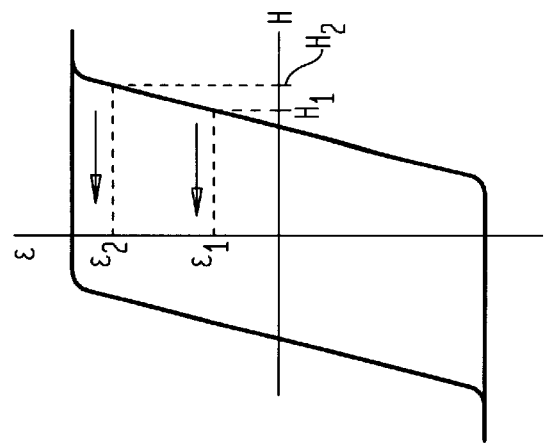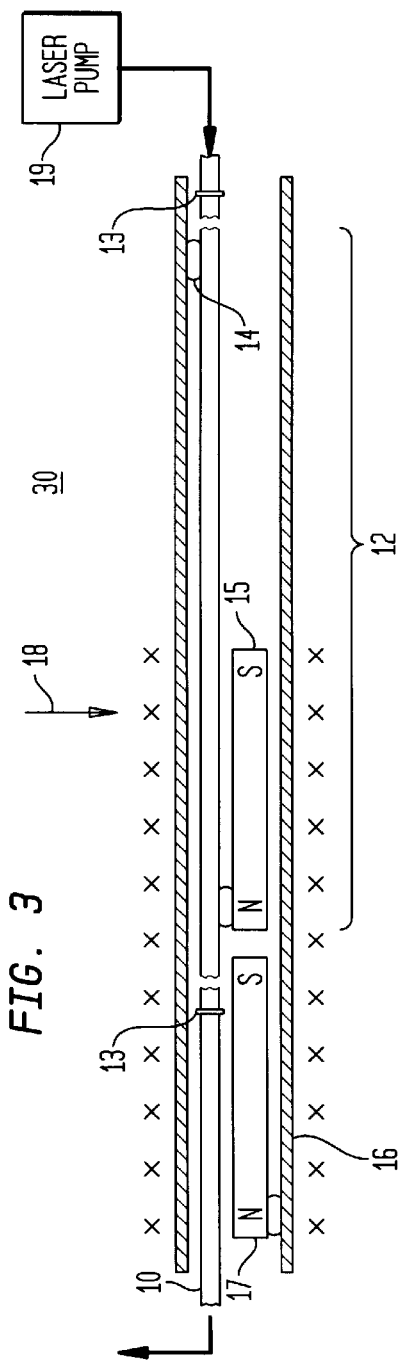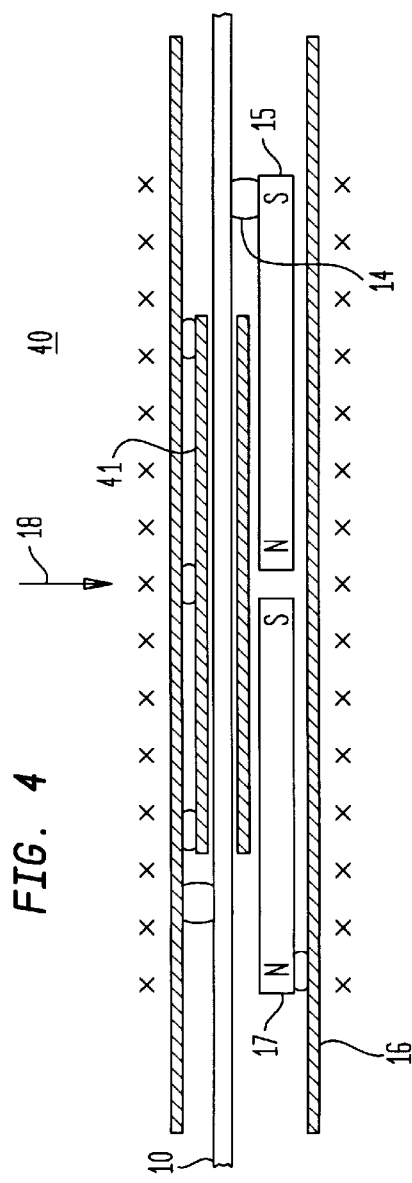

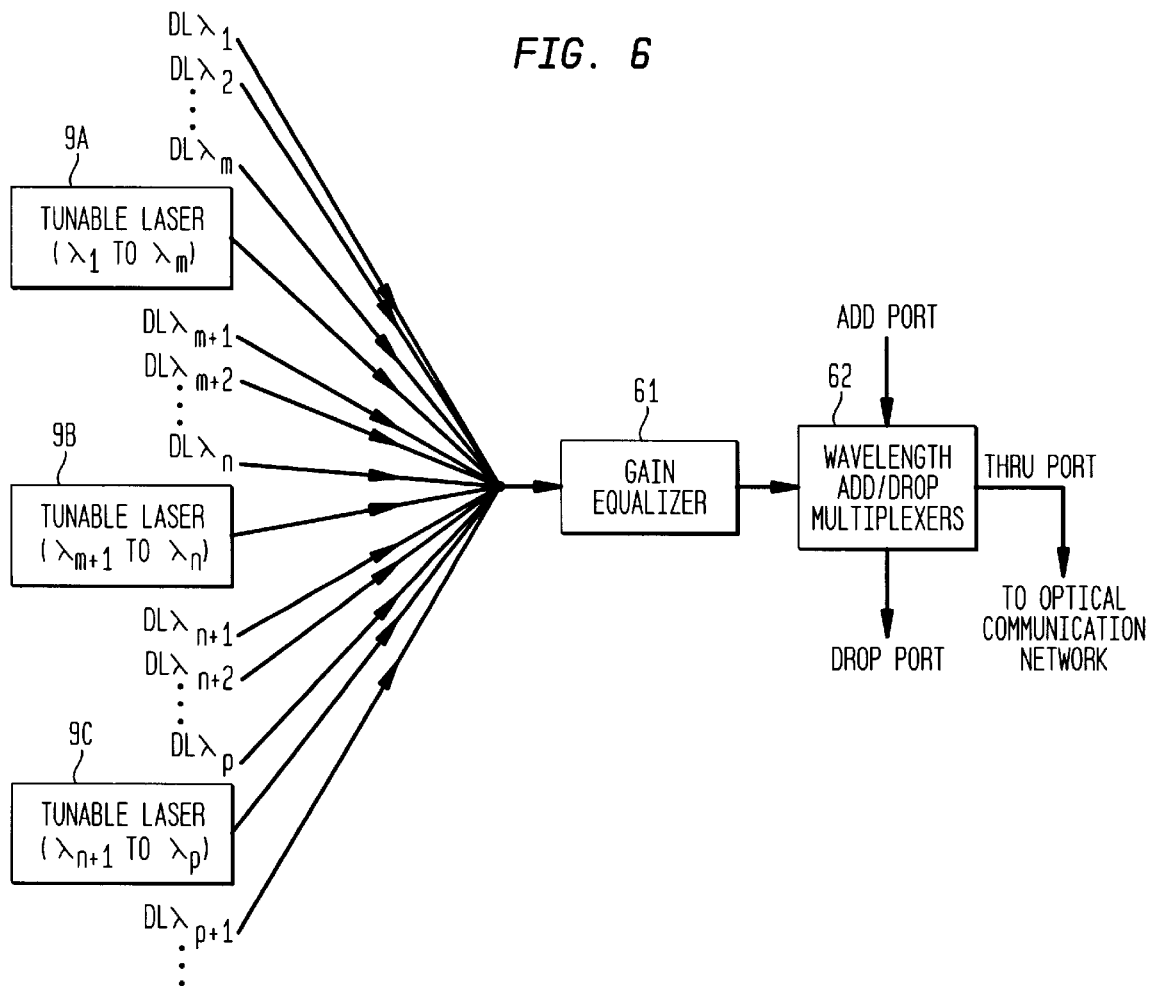

MAGNETICALLY TUNABLE LASER WITH WAVELENGTH LATCHABILITY AND OPTICAL COMMUNICATION SYSTEM COMPRISING SUCH LASER

FIELD OF THE INVENTION

The present invention relates to optical lasers that can be magnetically tuned to a broad range of wavelengths and, in particular, to lasers which can be latched without requiring continuous power to maintain a selected wavelength.

BACKGROUND OF THE INVENTION

There is an increasing demand for laser sources that can be tuned over a wide range of wavelengths. One application of growing importance is in multiwavelength optical networks, especially DWDM networks. Such tunable lasers can maximize the transmission capacity of multiwavelength optical networks by providing different wavelengths on demand and can improve network reliability by serving as standbys for sets of single-frequency lasers whose wavelengths fall within the tunable laser bandwidths.

Various methods of delimiting the laser optical resonance cavity use reflective optics: narrow band reflectors such as prisms, gratings and other dichroic filters or broadband reflectors such as reflective coatings and dielectric mirrors. For tuning, the characteristic reflective wavelength at one end of the laser cavity can be altered to select the lasing wavelength. A tuning range comparable to the laser gain bandwidth would permit the whole bandwidth to be utilized.

The laser cavity can be implemented in a waveguide such as an optical fiber or a planar waveguide doped with a laser amplifying element (e.g. a rare-earth element such as erbium, neodymium, ytterbium). The cavity can also be implemented in a semiconductor. Changing the length of the laser optical cavity provides wavelength-tuning of the laser.

In some applications discontinuous jumps between adjacent longitudinal modes (mode hopping) impedes smooth tuning. Smooth continuous tuning without mode hopping has been achieved by concurrently altering a wavelength dependent feedback of the resonator (refraction grating or Fabry-Perot etalon) and the length of the optical cavity. But this approach is complex and expensive to implement, involving sophisticated controls and optic mounts with close tolerances. Another attempt used piezoelectric transducers (PZTs) to strain an optical fiber comprising of two fiber Bragg gratings and an intervening rare-earth-doped region. See U.S. Pat. No. 5,317,576, issued to Frederick Leonberger et al. on May 31, 1994 and entitled "Continuouly Tunable Single-Mode Rare-Earth Doped Pumped Laser Arrangement." While this method eliminates mode hopping during tuning, the strain produced by the piezoelectric effect is relatively small, limiting the tunable range of the device (a 0.8 nm maximum shift in wavelength for a 15 cm long piezoelectric transducer). Laser gain media with bandwidths of 40–60 nm are now available, and so it is desirable to have a much broader tuning range. In addition to having a limited tuning range, a PZT also requires a sustained application of electric power with relatively high voltage, e.g. typically ~100 volts. Magnetostrictive tuning suffers from similar drawbacks.

An alternative way to tune a laser having fiber Bragg grating reflectors is through thermal variation. The thermally-induced refractive index change in a fiber Bragg grating produce a wavelength shift of roughly 0.01 nm/° C. Since the reflective properties of the grating start to degrade above 100–200° C., the practical thermal tuning range is about 1 nm. In addition, thermal tuning is slow (of the order of several seconds), and also requires sustained power.

Accordingly there is a need for a laser that is quickly and latchably tunable over a large range of the gain bandwidth.

SUMMARY OF THE INVENTION

In accordance with the invention, a tunable laser uses magnets to apply mechanical strain on fiber Bragg grating reflectors or laser cavities in order to induce a change in lasing wavelength. The strain can be tensile or compressive. The tunable laser comprises a laser cavity including a laser material for emitting light in response to stimulating light and two end reflectors one or more of which can be a Bragg grating. In preferred embodiments, latchable programmable magnets vary the grating periodicity and/or cavity length in a controlled, accurate manner so as to achieve desired tuning of the laser over a broad range of wavelengths. The latchable magnets hold the wavelength in the shifted position without the need for sustained power.

BRIEF DESCRIPTION OF THE INVENTION

The advantages, nature and additional features of the invention will appear more fully upon consideration of the illustrative embodiments described in the accompanying drawings. In the drawings:

FIG. 1 schematically illustrates a tunable laser device wherein tuning is achieved by magnetic straining of the Bragg reflector at one end of the cavity.

FIG. 2 illustrates a tunable laser where tuning is provided by magnetically straining two Bragg gratings and the laser cavity.

FIG. 3 is a tunable laser with tuning obtained by changing the length of the laser cavity.

FIG. 4 shows an arrangement for imparting a controllably latchable compressive strain to an optical fiber or waveguide using programmable magnets.

Figure 7:
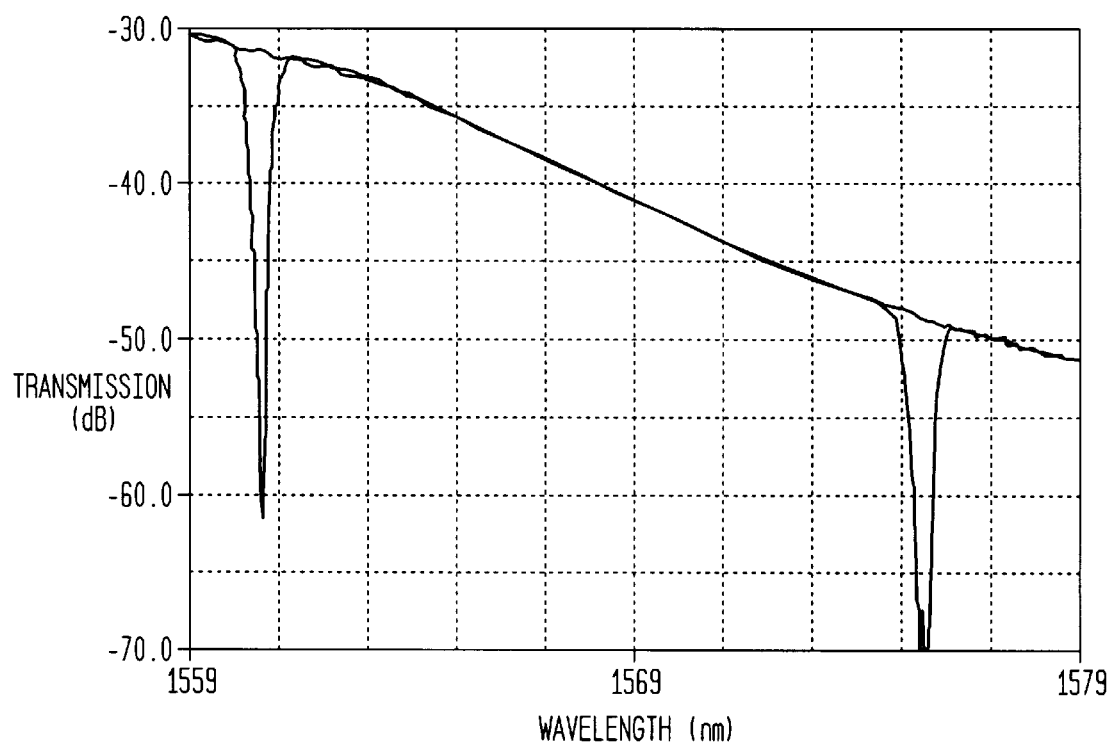

FIG. 5 schematically illustrates the latchability of magnetically generated strain and the resultant wavelength.

FIG. 6 illustrates an exemplary multi-wavelength laser source for a WDM optical network;

FIG. 7 illustrates large latchable wavelength shift obtainable from magnetic straining of a fiber Bragg grating.

It is to be understood that these drawings are for purposes of illustrating the concepts of the invention and are not to scale.

DETAILED DESCRIPTION

Referring to the drawings, FIG. 1 schematically illustrates an exemplary tunable waveguide laser 9, comprising a length of optical waveguide 10 (fiber or planar waveguide) including a laser cavity 12 incorporating a laser gain medium, and a pair of reflectors 11, 13, defining the cavity. Advantageously, one or both of the reflectors can be a Bragg grating, for example, reflector 11 can be a Bragg grating and reflector 13 can be a broadband reflector 13 that reflects a broad range of wavelengths. In this configuration, the Bragg grating 11 acts as the narrow-band reflector which selects the wavelength of lasing. A laser pump 19 is provided to support lasing. Tuning is achieved by changing the length of the cavity or the characteristic reflection wavelength of the Bragg grating through magnetic force.

The grating 11 is secured, as by bonds 14 or mechanical attachment, between a mobile programmable magnet 15 and a guiding container 16 for transmitting magnetic force from the magnet to the grating. A fixed magnet 17 bonded to container 16 provides attractive force of varying magnitude to the mobile magnet depending on the applied pulse magnetic field. The mobile magnet 15 can have guided cylindrical shape, but non-round cross-sectional shapes are preferred in order to minimize fiber twisting during handling or service. One or more electromagnets (solenoids) 18 are disposed adjacent to the magnets 15, 17 for providing a sufficient magnetic field to change the remnant magnetization in them. The guiding container 16 is preferably a tube but can have other configurations such as a two-part assembly with u-shaped bottom and top pieces.

The guiding container 16 is typically a tube made of glass, quartz, metal or plastic. The grating 11 is attached to the mobile magnet 15 and the guiding container 16 either by mechanical clamping or by bonds 14, as with epoxy, low melting point glass, or solder. In the use of solder, the waveguide surface is desirably coated with a metal layer to improve solder bond strength. As illustrated in FIG. 1, the mobile and the fixed magnets are aligned with a gap 20 between them.

The fixed magnet 17 is bonded onto the guiding container 16 as by epoxying, soldering, welding, or screws. To assure strong bonding and to minimize strain relaxation at the bond interface, the use of mechanically strong, non-thermoplastic adhesive, fusible glass adhesive, or a solder with a relatively high melting point, high mechanical strength and high creep resistance is desired. The waveguide surface to be attached is desirably coated with a metallization layer to improve the solder bond strength.

The preferred materials for the programmable magnets 15, 17 are those whose magnetic properties are modifiable by a pulse magnetic field. Some examples of suitable magnets are Fe-Cr-Co, Fe-Al-Ni-Co (Alnico), Cu-Ni-Fe (Cunife), Co-Fe-V (Vicalloy), specially-processed, low-coercivity ($H_c$) rare earth cobalt (Sm-(Co) or Nd-Fe-B magnets, and Ba-ferrite or Sr-ferrite magnets. The desired range of the coercivity for the programmable magnet is typically below 500 Oe and preferably below 100 Oe for the ease of programming by re-magnetization using solenoid pulse field. The coercivity is typically above 10 Oe and preferably above 30 Oe for maintaining the stability of the remanent magnetization and also for stability against demagnetization due to stray magnetic fields. For satisfactory latchability of magnetization when the field is removed, the programmable magnet should have a square magnetization hysteresis loop with the squareness ratio (remanent magnetization/saturation magnetization) of at least 0.85, preferably at least 0.90, even more preferably at least 0.95. For ease of control, the loop is desirably skewed by at least 50% of $H_c$, for example, as described in U.S. patent application Ser. No. 09/020,206, filed by Espindola el al on Feb. 6, 1998, and entitled "Magnetically Reconfigurable Optical Grating Devices and Communication Systems" which is incorporated herein by reference. Mechanically ductile and easily formable or machineable magnet alloys such as Fe-Cr-Co, Cu-Ni-Fe, Co-Fe-V are particularly desirable for shaping into a desired configuration such as a rod. Stable permanent magnets with high coercive forces (e.g., $H_c > 1000$ Oe), such as Sm-Co or Nd-Fe-B are less desirable (unless modified to exhibit lower coercive forces) because of the difficulty in reprogramming the remnant magnetization using desirably low magnetic field.

In operation, the mobile magnet 15 and the fixed magnet 17 are attracted to each other with a force that is determined by the remnant magnetization in them. The remnant magnetization in turn is controlled by the applied pulse field fiom the solenoid 18. The force transmitted from the magnet 15 to the grating 11 produces a strain which changes the wavelength response of the grating. The force between two attracting magnets is approximately proportional to the square of the magnetic induction (M) multiplied by the cross-sectional area (A) of the magnets at the gap (F $M^2$ · A). Thus stronger magnets (higher M) or larger magnets (larger A) give stronger force. However, strong magnets with high coercivity are difficult to magnetically switch. When the grating is stretched or compressed, e.g., 1% in length ($\epsilon = \Delta l/l = 0.01$), the grating periodicity $\Lambda$ will also change. However, the resonating Bragg reflection wavelength $\lambda$ will not change by exactly 1%, since the interatomic distance in the glass is also affected by the elastic strain and as a result the refractive index n is altered. This strain effect on the refractive index can be represented by a photoelastic constant $P_\epsilon$ which is typically about 0.22 for $SiO_2$ fiber. The wavelength change induced by the magnetically applied strain $\epsilon$ ($\epsilon = \Delta l/l$) is thus expressed as $\Delta \lambda / \lambda = (\Delta l/l)(1-P_\epsilon) = \epsilon(1-P_\epsilon)$. The strain $\epsilon$ is Determined by the applied stress ($\sigma$) and the elastic modulus (E), $\epsilon = \sigma/E$, and the stress on the waveguide is the force (F) divided by the cross-sectional area ($\pi r^2$ for a fiber grating, where r is the radius of the fiber).

FIG. 2 is an alternative embodiment of a tunable laser 20 using two Bragg gratings 11A and 11B. Laser 20 offers smooth tuning by proportionately straining the two end Bragg reflectors 11A and 11B as well as the laser cavity 12. This proportionate straining substantially eliminates mode hopping.

FIG. 3 is an alternative tunable laser 30 omitting Bragg grating 11. The tuning is achieved by magnets 15, 17 changing the laser cavity length.

Since optical fiber tends to break at a tensile strain of about 6%, and since such a failure would be disastrous, it is highly desirable to have a tunable grating design that automatically provides an upper limit in total tensile strain. The assembly configurations of FIGS. 1–4 advantageously utilize a pre-set gap 19 between the magnets serves as the upper limit for tensile elongation of the fiber. The desired length of the gap 19 between the magnets 15, 17 in FIG. 1 (the upper limit in fiber elongation) is typically less than 4% of the fiber length being stretched (e.g., for 2" long fiber contairing the grating, the gap is set below ~80 mil), and preferably less than 1% of the length of the grating-containing fiber.

Since optical fiber is more than twenty times stronger in compression than in tension, configurations which achieve tuning through compressive stress may be advantageously employed. FIG. 4 illustrates such a laser 40 wherein a close-fitting jacket 41 (e.g. sleeve, or ferrule) is provided to prevent buckling of the waveguide 10 while allowing free sliding. The magnets 15, 17 are positioned and bonded to compress the fiber 10. The compressive tuning of FIG. 4 is applicable to all of the three configurations illustrated in FIGS. 1–3.

An important advantage of the tunable laser of FIG. 1 is the latchability of the shifted wavelength. After a short-duration current pulse to the solenoid for actuation, the mobile magnet is latched at a certain position (determined by the equilibrium between the magnetic force at the gap between the poles, and the stress in the waveguide) and electrical power is no longer needed. An Fe-28% Cr-7% Co alloy is deformation-aged to yield a square M-H loop with $H_c$ of 70 Oe, a dimension of 0.180" diameter and 4" length. The M-H Loop is skewed by ~60 Oe, producing a M-H loop similar to FIG. 5. For applied magnetic fields of $H_1$ and $H_2$, the corresponding magnetization is latchably retained after the field is removed, and hence the induced strains, $\epsilon_1$ and $\epsilon_2$, are also latchably retained. Therefore the device can be operated without continuous power. To alter the degree of tuning of the strain in the grating, the strain is altered and latched by changing the magnetization in the programmable magnets. This can be achieved by either increasing the applied field or by demagnetizing first and remagnetizing to a new field level.

For magnetization of the magnets using a solenoid, a pulse field (a pulse current in the solenoid) can conveniently be used for high-speed, low-power operation of the devices. The desired duration or speed of the pulse field is typically in the range of $10$–$10^{-6}$ seconds, preferably $10^{-1}$–$10^{-4}$ seconds. The shape of the current pulse applied can be sinusoidal, rectangular, trapezoidal, triangular or irregular. The solenoid can be a single solenoid or it can be split into two or more segments with independent control.

FIG. 6 shows an exemplary multi-wavelength laser source 60 for a WDM optical network comprising a plurality of tunable laser sources 9A, 9B, 9C. In essence, source 60 comprises a plurality of discrete wavelength sources $DL\lambda_1$ to $DL\lambda_{p+1}$, a plurality of tunable lasers 9 tunable over respective subsets of discrete source wavelengths, a gain equalizer 61 for equalizing the signal level at different wavelengths, and an ADD/DROP multiplexer 62 for wavelength selection. Each of the tunable lasers can serve as an emergency back-up source in case any one of the discrete wavelength lasers within its tunable range fails, therefore improving network reliability. For example, source 9A can be a back up for discrete lasers $DL\lambda_1 \ldots DL\lambda_m$. In addition, in times of network overload, the tunable sources can provide wavelengths different from those currently being used, and thus improve the information-carrying capacity of the network.

FIG. 7 shows the wavelength shift obtained in a fiber Bragg grating by magnetically straining it in tension. The data shows a sufficiently large tuning range of the Bragg wavelength to implement a tunable laser with a broad range of tuning.

Since some applications require broad bandwidth lasers rather than sharp, narrow wavelength laser output, it is possible to broaden the bandwidth by an end reflector comprising a broad bandwidth Bragg grating, such as a chirped grating. Alternatively, the bandwidth of the laser can be made tunable (in addition to the center wavelength being tunable) through the use of programmable-bandwidth Bragg gratings at at least one end of the laser cavity. For example, a strain-gradient-generating structure such as a tapered fiber grating or a composite structure comprising the grating and a lengthwise bonded gradient-generating body can produce the shift of center wavelength as well as induce a broadening of laser bandwidth. The initial Bragg grating in this Case may be a non-chirped or chirped grating. The required strain in the grain can be provided by programable magnets, or mechanically by motors, pneumatic force, hydraulic force, gravity, piezoelectric elements, or magnetostrictive elements. In the case of bonded gradientgenerating body, the body can have a thickness gradient, a width gradient, or a porosity gradient. Alternatively, a gradient in magnetostriction, thermal expansion, or temperature can be utilized to induce the desired chirping and broadening.

It is to be understood that the above mentioned embodiments are illustrative of only a few of the many possible specific embodiments which can represent applications of the invention. Numerous and varied other arrangements can be, made by those skilled in the art without departing from the spirit and scope of the invention.

What is claimed:

1. A tunable waveguide laser source comprising:
   a laser optical waveguide cavity including a laser gain medium and a pair of end reflectors;
   an optical pump for stimulating the gain medium; and
   a plurality of magnets for applying strain to the cavity or at least one end reflector, whereby the laser is tuned by altering either the length of the cavity or the characteristic reflection wavelength of the end reflector.

2. A device according to claim 1 wherein at least one of the magnets is programmable and at least one of the magnets is bonded to the laser waveguide.

3. The device of claim 2 wherein the programmable magnet is latchable whereby the magnetically induced elastic strains in the grating laser cavity are latchable.

4. A device according to claim 3 wherein the latchable strain is at least 85%, of the strain when the field is on.

5. A device of claim 1 wherein the applied strain is tensile.

6. A device of claim 1 wherein the applied strain is compressive.

7. A device of claim 1 wherein said laser waveguide cavity is an optical fiber.

8. The device of claim 6 or 7 where the said laser waveguide cavity is doped with a rare earth element.

9. A device of claim 1 wherein said laser waveguide cavity is a planar waveguide.

10. A device of claim 1 wherein said laser waveguide cavity is a semiconductor.

11. The device of claim 1 wherein at least one of the end reflectors is a Bragg grating.

12. The device of claim 11 wherein the Bragg grating is an optical fiber Bragg grating.

13. The device of claim 11 wherein the Bragg grating is a planar waveguide Bragg grating.

14. A device of claim 11 wherein at least one grating is chirped.

15. The device of claim 1 wherein at least one of the end reflectors is a broadband reflector.

16. A device of claim 1 wherein the laser is continuously tunable.

* * * * *